United States Patent [19]

Momose

[11] Patent Number: 4,488,351
[45] Date of Patent: Dec. 18, 1984

[54] METHOD FOR MANUFACTURING SEMICONDUCTOR DEVICE

[75] Inventor: Hiroshi Momose, Yokohama, Japan

[73] Assignee: Tokyo Shibaura Denki Kabushiki Kaisha, Japan

[21] Appl. No.: 573,654

[22] Filed: Jan. 25, 1984

[30] Foreign Application Priority Data

Jan. 27, 1983 [JP] Japan ................... 58-11970

[51] Int. Cl.³ .................. H01L 21/308; H01L 21/265
[52] U.S. Cl. ....................................... 29/578; 29/571; 29/576 B; 357/23
[58] Field of Search ............... 29/576 W, 576 B, 571, 29/578, 591; 148/1.5; 357/23 S, 23 SC

[56] References Cited

U.S. PATENT DOCUMENTS

| | | | |
|---|---|---|---|
| 4,209,350 | 6/1980 | Ho et al. | 148/188 |
| 4,292,156 | 9/1981 | Matsumoto et al. | 204/192 EC |
| 4,337,132 | 6/1982 | Jones | 204/192 E |
| 4,356,623 | 11/1982 | Hunter | 29/571 |
| 4,376,336 | 3/1983 | Endo et al. | 29/571 |
| 4,432,132 | 2/1984 | Kinsbron et al. | 29/571 |

OTHER PUBLICATIONS

Tsang et al., "Fabrication of High-Performance LDDFET's with Oxide Sidewall-Spacer Technology," IEEE Transactions on Electron Devices, vol. Ed-29, No. 4, Apr., 1982.
Tsang, et al., "Sidewall Spacer Technology," ESC Abstract No. 233, p. 373, 1982.

Primary Examiner—Aaron Weisstuch
Assistant Examiner—Hunter L. Auyang
Attorney, Agent, or Firm—Finnegan, Henderson, Farabow, Garrett & Dunner

[57] ABSTRACT

A method for manufacturing a semiconductor device, capable of forming, with good controllability, impurity regions of a low impurity concentration, includes the steps of: forming a gate electrode on a surface of a semiconductor substrate through a gate oxide film; forming a first film on the surfaces of the gate electrode and the semiconductor substrate; forming a non-single-crystalline silicon film to cover the entire surface; forming a second film to cover the entire surface; performing anisotropic etching of the second film to form residual second films on the side walls of that step portion non-single-crystalline silicon film which is formed corresponding to a shape of the gate electrode; performing etching of the non-single-crystalline silicon film by using the residual second films as masks to form residual non-single-crystalline silicon films on the side walls of the gate electrode through the first film; ion-implanting an impurity having a conductivity type opposite to that of the semiconductor substrate by using as masks the gate electrode and the residual non-single-crystalline silicon films; removing the residual non-single-crystalline silicon films; and annealing a resultant structure to activate the impurity so as to form source and drain regions each of which comprises an impurity region of a high impurity concentration and an impurity region of a low impurity concentration which is adjacent to the impurity region of the high impurity concentration and which is located under a structure area corresponding to one of the removed non-single-crystalline silicon films.

9 Claims, 15 Drawing Figures

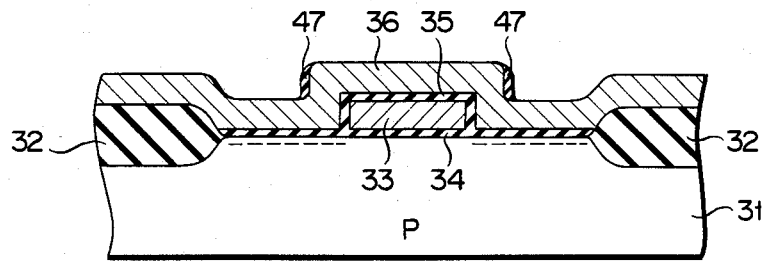
F I G. 4C
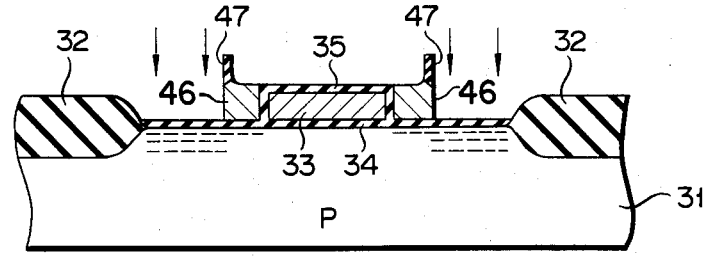
F I G. 4D
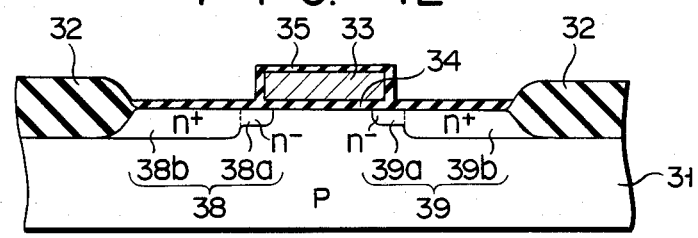
F I G. 4E
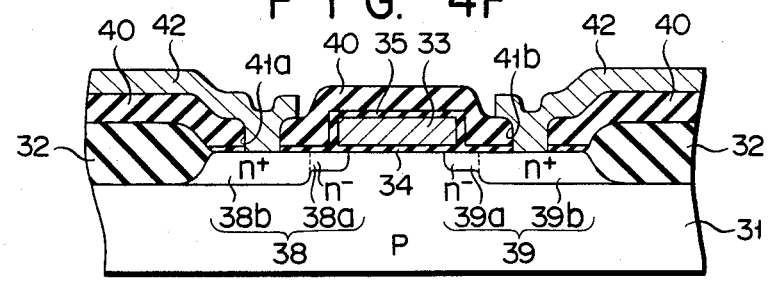
F I G. 4F

METHOD FOR MANUFACTURING SEMICONDUCTOR DEVICE

BACKGROUND OF THE INVENTION

The present invention relates to a method for manufacturing a semiconductor device and, more particularly to a method for manufacturing a MOS semiconductor device having an LDD (lightly doped drain) structure.

Along with micropatterning of MOS semiconductor devices, hot carriers are generated by a high electric field in a channel region in the vicinity of a drain region, leading to degradation of device characteristics, such as a change in threshold voltage and a decrease in MOS gain. In order to solve these problems, an LDD structure shown in FIG. 1 is proposed.

In the MOS transistor shown in FIG. 1, a source region 2 and a drain region 3 are formed in a surface region of a p-type silicon substrate 1. The source region 2 comprises an n⁻-type region 2a of a low impurity concentration and an n⁺-type region 2b of a high impurity concentration. The drain region 3 comprises an n⁻-type region 3a of a low impurity concentration and an n⁺-type region 3b of a high impurity concentration. The impurity concentrations of the n⁻-type regions 2a and 3a are set to be $10^{16}$ to $10^{18}$ cm$^{-3}$, and the impurity concentrations of the n⁺-type regions 2b and 3b are set to be about $10^{19}$ to $10^{21}$ cm$^{-3}$. A gate electrode 5 is formed on a channel region between the n⁻-type regions 2a and 3a through a gate oxide film 4. In this manner, the n⁻-type region 3a is formed in that portion of the drain region 3 which is located on the side of the channel region, so that a high electric field in the channel region can be weakened. The above problems can thus be solved.

In the manufacturing process of the MOS semiconductor device having the LDD structure, it is important to control a width $L\alpha$ of the n⁻-type region 3a. The following three methods for manufacturing a MOS semiconductor device having an LDD structure in consideration of control of the width $L\alpha$ are proposed.

(i) The first method will be described with reference to FIGS. 2A to 2D.

After a field oxide film 12 is formed by selective oxidation in a surface region of a p-type silicon substrate 11, a thermal oxide film 13 serving as a gate oxide film is formed on a prospective element formation surface surrounded by the field oxide film 12. A polycrystalline silicon film, a silicon nitride film and a CVD oxide film are sequentially formed and patterned to form a polycrystalline silicon film pattern 14, a silicon nitride film pattern 15 and a CVD oxide film pattern 16 which are larger in size than a final gate electrode. Subsequently, an n-type impurity is ion-implanted in the silicon substrate 11 at a high dose using these patterns as a mask (FIG. 2A).

Only the peripheral portion of the polycrystalline silicon pattern 14 is selectively side-etched to form a gate electrode 17 (FIG. 2B).

After the CVD oxide film pattern 16 and the silicon nitride film pattern 15 are sequentially removed, an n-type impurity is ion-implanted at a low dose in the silicon substrate 11 using the gate electrode 17 as a mask (FIG. 2C).

Thereafter, annealing is performed to activate ion-implanted layers formed by performing the above ion implantation technique twice to form a source region 18 and a drain region 19. The source region 18 comprises an n⁻-type region 18a and an adjoining n⁺-type region 18b, and the drain region 19 comprises an n⁻-type region 19a and an adjoining n⁺-type region 19b (FIG. 2D).

A CVD oxide film is deposited in accordance with a known technique, and contact holes are then formed therein. An aluminum film is deposited to cover the entire surface and is patterned to obtain an aluminum wiring layer. As a result, a MOS transistor having an LDD structure is prepared.

The main feature of the method described above lies in that ion implantation at a high dose in the step of FIG. 2A and ion implantation at a low dose in the step of FIG. 2C are controlled by a width of the polycrystalline silicon pattern 14 and a width of the gate electrode 17. In other words, the width $L\alpha$ of each of the n⁻-type impurity regions 18a and 19a is controlled by side etching of the polycrystalline silicon pattern 14 in the step of FIG. 2B.

However, it is difficult to control the side etching amount of the polycrystalline silicon pattern 14, so a high yield cannot be assured in the manufacture of LSIs.

(ii) The second method will be described with reference to FIGS. 3A to 3D.

A field oxide film 22 is selectively formed in a surface regin of a p-type silicon substrate 21 in accordance with a known technique. A gate electrode 24 is formed through a gate oxide film 23 in that element formation region of the p-type silicon substrate 21 which is surrounded by the field oxide film 22. Using the gate electrode 24 as a mask, an n-type impurity is ion-implanted at a low dose (FIG. 3A).

A CVD oxide film 25 is then deposited to cover the entire surface (FIG. 3B).

The CVD oxide film 25 is etched by anisotropic etching to form residual CVD oxide films (to be referred to as side wall films hereinafter) 26 on the side walls of the gate electrode 24. A width of each of the side wall films 26 is the same as a width $L\alpha$ of a corresponding n⁻-type impurity region to be formed. Using the gate electrode 24 and the side wall films 26 as masks, an n-type impurity is ion-implanted at a high dose (FIG. 3C).

Thereafter, annealing is performed to activate ion-implanted layers formed by performing the above ion implantation technique twice to form a source region 27 and a drain region 28. The source region 27 comprises an n⁻-type region 27a and an adjoining n⁺-type region 27b, and the drain region 28 comprises an n⁻-type region 28a and an adjoining n⁺-type region 28b (FIG. 3D).

A wiring layer is formed in accordance with a known technique to prepare a MOS semiconductor device having an LDD structure.

This method has the following disadvantages:

(1) When the CVD oxide film 25 is etched by anisotropic etching to form the side wall films 26 in the step shown in FIG. 3C, side etching occurs, and the width of each of the side wall films 26 differs from a designed width. Therefore, the width $L\alpha$ cannot be properly controlled. Furthermore, since anisotropic etching cannot be uniformly performed within the wafer, the width $L\alpha$ varies.

(2) It is difficult to determine the end of anisotropic etching. Furthermore, an etching margin is small.

(3) When the CVD oxide film 25 is formed in the step shown in FIG. 3B, step coverage is poor at the upper and lower corners of the side walls of the gate electrode 24. For this reason, incomplete insulation between the gate electrode 24 and the silicon substrate 21 occurs, and the shape of the gate electrode is deteriorated by anisotropic etching. In addition to these problems, when the CVD oxide film 25 is overetched beyond the etching margin, the surface portions of the silicon substrate 21 which become source and drain regions are exposed to the anisotropic etchant (ions) and are damaged. In the worst case, these surface portions are etched, and the film thickness of the field oxide film 22 is decreased.

According to this method, the width $L\alpha$ of each of the $n^-$-type impurity regions 27a and 28a can hardly be controlled, and other problems also occur.

(iii) According to the third method, ion implantation at a high dose and ion implantation at a low dose are selectively performed. Since the width $L\alpha$ of each of the $n^-$-type impurity regions is less than 1 $\mu$m, controllability of the width $L\alpha$ is greatly degraded.

SUMMARY OF THE INVENTION

It is an object of the present invention to provide a method for manufacturing a semiconductor device having a highly reliable LDD structure by forming, with good controllability, impurity regions of a low impurity concentration in source and drain regions.

In order to achieve the above object of the present invention, there is provided a method for manufacturing a semiconductor device, comprising the steps of: forming a gate electrode on a surface of a semiconductor substrate through a gate oxide film; forming a first film on surfaces of said gate electrode and said semiconductor substrate; forming a non-single-crystalline silicon film to cover an entire surface; forming a second film to cover an entire surface; performing anisotropic etching of said second film to form residual second films on side walls of that step portion of the non-single-crystalline silicon film which is formed corresponding to a shape of said gate electrode; performing etching of said non-single-crystalline silicon film by using said residual second films as masks to form residual non-single-crystalline silicon films on said side walls of said gate electrode through said first film; ion-implanting an impurity of a conductivity type opposite to that of said semiconductor substrate by using as masks said gate electrode and said residual non-single-crystalline silicon films; removing said residual non-single-crystalline silicon films; and annealing a resultant structure to activate the impurity so as to form source and drain regions each of which comprises an impurity region of a high impurity concentration and an impurity region of a low impurity concentration which is adjacent to said impurity region of high impurity concentration and which is located under a structure area corresponding to one of said residual non-single-crystalline silicon films which have been removed.

The impurity regions of the low impurity concentration in portions of said source and drain regions which are located in the vicinity of a channel region are formed in accordance with the following two processes.

Process (1) comprises ion implantation at a low dose by using the gate electrode as a mask.

According to process (1), the source and drain regions are formed by ion implantation at a low dose when the gate electrode is used as a mask, by ion implantation at a high dose when the residual non-single-crystalline silicon films are used as masks, and by annealing after ion implantation. The first ion implantation is performed after the gate electrode is formed and before the non-single-crystalline silicon film is formed. Alternatively, the first ion implantation is performed after the residual non-single-crystalline silicon films are removed. It should be noted the impurity used in either ion implantation step has a conductivity type opposite to that of the semiconductor substrate.

Process (2) is performed such that an impurity which is easy to diffuse and another impurity which is difficult to diffuse are ion-implanted using the residual non-single-crystalline silicon films as masks, and annealing is performed to laterally diffuse the impurity which is easy to diffuse. These impurities have a conductivity type opposite to that of the semiconductor substrate.

According to process (2), the impurity which is easy to diffuse is also vertically diffused, and a short channel effect tends to occur. In order to prevent such short channel effect, it is preferred that an impurity having the same conductivity type as that of the semiconductor substrate is ion-implanted at a depth greater than those of the impurities having the conductivity type opposite to that of the semiconductor substrate by using as the mask/masks the gate electrode or the residual non-single-crystalline silicon films before the non-single-crystalline silicon film is formed or after the non-single-crystalline silicon film is etched. The ion implanation of the impurity having the same conductivity type as that of the semiconductor substrate can also be performed in process (1) to prevent the short channel effect.

It should be noted that the non-single-crystalline silicon film may comprise herein a polycrystalline silicon film or an amorphous silicon film.

The first film can comprise a material different from the non-single-crystalline silicon film (i.e., material having etching selectivity) and can be exemplified by a thermal oxide film; and an oxide film and a silicon nitride film which are formed by CVD or sputtering.

The second film can also comprise a material (i.e., material having etching selectivity) different from the non-single-crystalline silicon film and can be exemplified by films such as: a thermal oxide film; an oxide film and a silicon nitride film which are formed by CVD or sputtering; and metal films such as Al and Mo films which are formed by evaporation.

Isotropic or anisotropic etching can be used to etch the non-single-crystalline silicon film using the residual second films as masks. A combination of the isotropic and anisotropic etching methods can be utilized such that anisotropic etching and then isotropic etching are performed.

According to the method of the present invention, the source and drain regions of the LDD structure can be formed with good controllability, thereby manufacturing a highly reliable MOS type semiconductor device.

BRIEF DESCRIPTION OF THE DRAWINGS

FIGS. 4A to 4F are respectively sectional views for explaining the steps of manufacturing a MOS type semiconductor device having the LDD structure according to an embodiment of the present invention.

DETAILED DESCRIPTION OF THE PREFERRED EMBODIMENT

An embodiment of the present invention will be described with reference to FIGS. 4A to 4D.

Figure 1:
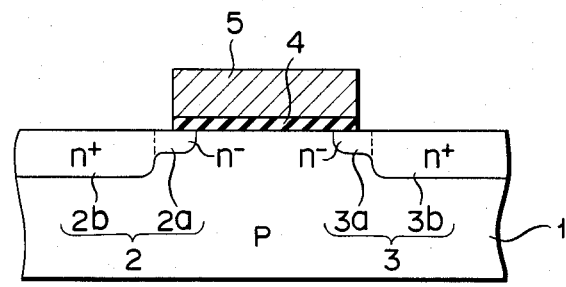
FIG. 1 is a sectional view of a MOS type semiconductor device having an LDD structure.
Figure 2A:
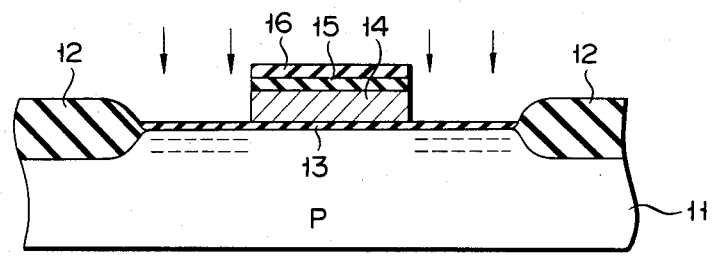
FIGS. 2A to 2D are respectively sectional views for explaining the steps of manufacturing a conventional MOS type semiconductor device having an LDD structure.
Figure 2B:
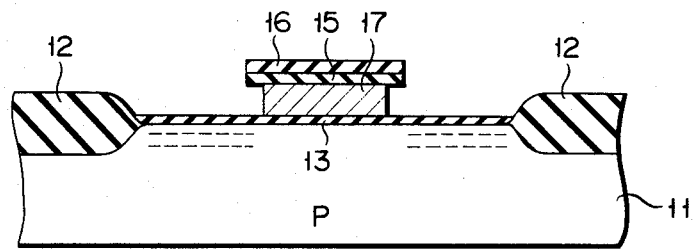
Figure 2C:
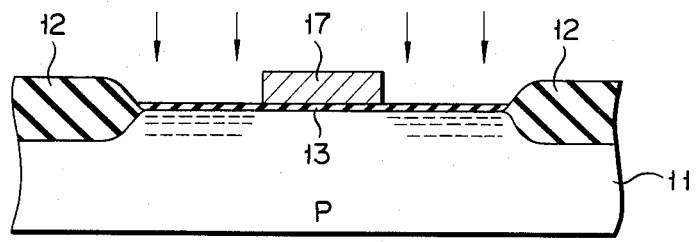
Figure 2D:
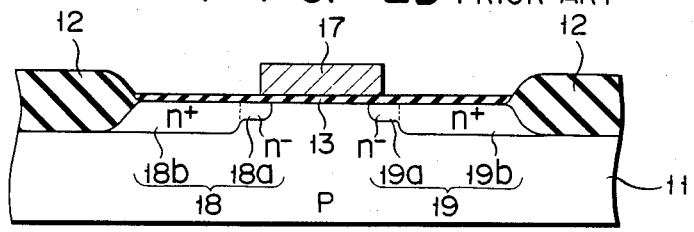
Figure 3A:
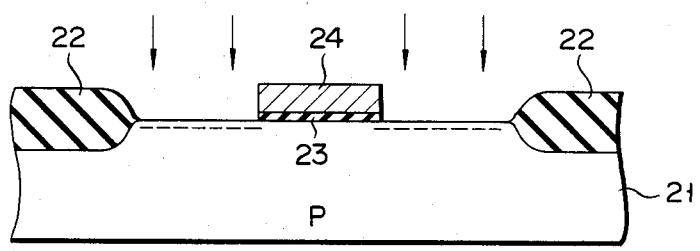
FIGS. 3A to 3D are respectively sectional views for explaining the steps of manufacturing another conventional MOS type semiconductor device having an LDD structure.
Figure 3B:
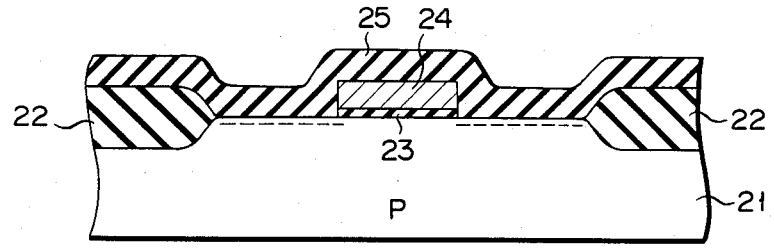
Figure 3C:
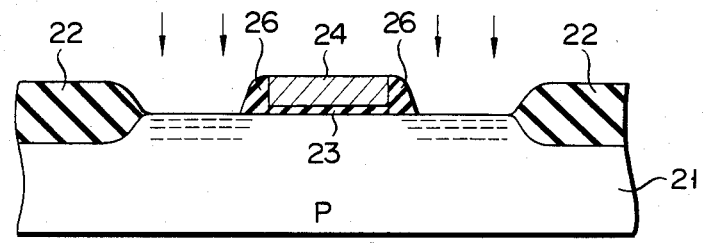
Figure 3D:
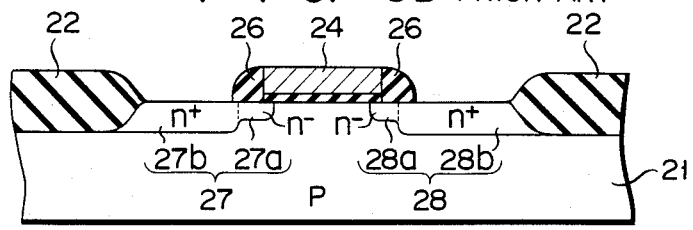
Figure 4A:
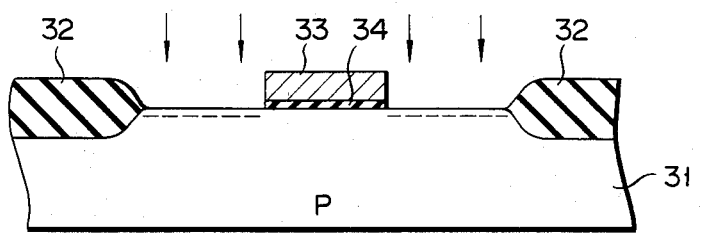

After a field oxide film 32 was formed by selective oxidation in a surface layer of a p-type silicon substrate 31, a thermal oxide film to be serving as a gate oxide film was formed on an element formation region surrounded by the field oxide film 32. A polycrystalline silicon film was then deposited to cover the entire surface and was patterned to form a gate electrode 33. The thermal oxide film was etched using the gate electrode 33 as a mask, thereby forming a gate oxide film 34. Using the gate electrode 33 as a mask, arsenic or phosphorus ions were ion-implanted at a dose (in subsequent annealing, diffusion layers having an impurity concentration of $10^{16}$ to $10^{18}$ cm$^{-3}$ were formed) (FIG. 4A).

Figure 4B:
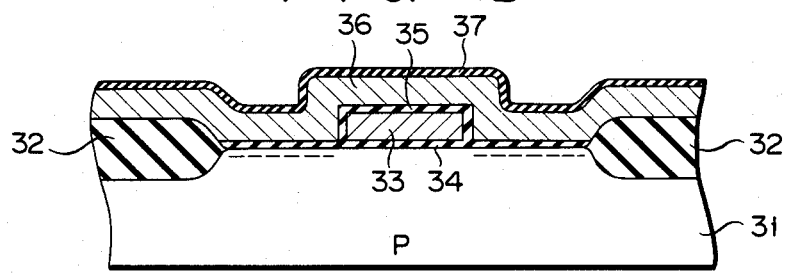

Thermal oxidation was then performed to form a thermal oxide film 35 as a first film on the exposed surface of the substrate 31 and the surface of the gate electrode 33 to a thickness of 400 Å (in general, the first film has a thickness of 100 to 500 Å). A polycrystalline silicon film 36 was deposited to cover the entire surface to a thickness of 0.5 μm (in general, the polycrystalline silicon film has a thickness of 0.1 to 1 μm). The polycrystalline silicon film had good step coverage for the shape of the gate electrode 33, so that a step portion having substantially vertical walls was obtained. In should be noted that the thickness of the polycrystalline silicon film 36 is an important factor to determine a width $L\alpha$ of each of the n$^-$-type regions of the source and drain regions to be described later, so that the thickness must be accurately controlled. Thermal oxidation was then performed to form a thermal oxide film 36 as a second film on the surface of the polycrystalline silicon film 35 to a thickness of 500 Å (FIG. 4B). It should be noted that the thermal oxide film 37 will be used as a mask in anisotropic etching in the subsequent process and will become an important factor for determining the width $L\alpha$ of the corresponding n$^-$-type region. A thickness of this oxide film 37 is smaller than that of the polycrystalline silicon film 37 and falls within the range of 100 to 1,000 Å.

The thermal oxide film 37 was then etched by reactive ion etching (RIE). In this case, residual thermal oxide films 47 were formed on the side walls of the polycrystalline silicon film 36 corresponding to the shape of the gate electrode 33 (FIG. 4C).

The polycrystalline silicon film 36 is etched by reactive ion etching using the residual thermal oxide films 47 as masks. As a result, residual polycrystalline silicon films 46 were formed on the walls of the gate electrode 33 through the thermal oxide film 35 while the residual thermal oxide films 47 were respectively left at edges of the residual polycrystalline silicon films 46. It should be noted that the residual thermal oxide films 47 prevent side etching of the polycrystalline silicon film 36 when the film 36 is etched, so that the width of each of the residual polycrystalline silicon films 46 is substantially the same as the thickness of the polycrystalline silicon film with good controllability. Arsenic or phosphorus was ion-implanted at a high dose using the gate electrode 33 and the residual polycrystalline silicon films 46 as a mask (FIG. 4D).

The residual polycrystalline silicon films 46 were removed by isotropic etching using fluorine series gas, halogen series gas, or alkali solution (e.g., KOH) as an etchant. At the same time, the residual thermal oxide films 47 were lifted off. Subsequently, thermal annealing was performed to activate ion-implanted layers obtained by performing ion implantation twice, thereby forming a source region 38 comprising an n$^-$-type impurity region 38a and an adjoining n$^+$-type impurity region 38b, and a drain region 39 comprising an n$^-$-type impurity region 39a and an adjoining n$^+$-type impurity region 39b (FIG. 4E).

A CVD oxide film 40 was then deposited to cover the entire surface of the resultant structure, and contact holes 41a and 41b were formed in the CVD oxide film 40. An aluminum film was deposited to cover the entire surface and was patterned to obtain an aluminum wiring layer 42. Thus, a MOS semiconductor device having an LDD structure was prepared (FIG. 4F).

According to the method as described above, since good step coverage of the polycrystalline silicon film 36 deposited to cover the entire surface in the step shown in FIG. 4B is obtained, the step portion having substantially vertical walls corresponding to the shape of the gate electrode 33 can be obtained. In the step shown in FIG. 4C, the thermal oxide film 37 as the second film is etched by anisotropic etching to form the residual thermal oxide films 47. Furthermore, in the step shown in FIG. 4D, using the residual thermal oxide films 47 as masks, the polycrystalline silicon film 36 is subjected to anisotropic etching, so that, side etching of the polycrystalline silicon film 36 can be prevented due to the presence of the residual thermal oxide films 47. Therefore, the width of each of the residual polycrystalline silicon films 46 corresponding to the width $L\alpha$ of the n$^-$-type impurity regions of the source and drain regions can be controlled with high precision. As a result, when the ion-implanted layers formed by ion implantation at a low dose using the gate electrode 33 shown in FIG. 4A as a mask and by ion implantation at a high dose using the gate electrode 33 and the residual polycrystalline silicon films 46 shown in FIG. 4D as masks are activated by annealing in FIG. 4E, each of the n$^-$-type impurity regions 38a and 39a of the source and drain regions 38 and 39 can have the designed width $L\alpha$ (e.g., 0.1 to 1 μm). Therefore, even if the gate length is patterned in the order of submicorns, a change in threshold voltage which is caused by hot electrons can be effectively prevented, thereby preparing the MOS semiconductor device having the LDD structure with high precision, and hence resulting in high reliability of the device.

In order to remove the residual polycrystalline silicon films 46 and the residual thermal oxide films 47 in the step shown in FIG. 4E, isotropic etching is performed in the above embodiment using an etchant for polycrystalline silicon. However, an etchant for an oxide may first be used to remove the residual thermal oxide films 47 and then the etchant for poly-silicon may be used to remove the residual polycrystalline silicon films 46. However, in this case, care must be taken not to expose the substrate 31 by removing the thermal oxide film 35 on the surface of the substrate 31 when the residual thermal oxide films 47 are etched. This drawback lies in the fact that the portions of the substrate 31 which correspond to the source and drain regions are etched when the residual polycrystalline silicon films 46 are etched. As a result, the etching process of the residual thermal oxide films 47 allows only a small margin. Unlike this modification, the above embodiment does not have the following drawbacks: the portions of the substrate 31 which correspond to the source and drain regions are not exposed; and the thickness of the field oxide film 32 is not decreased. Etching can be sufficiently performed to increase the margin, and the process can be simplified.

In the step shown in FIG. 4A of the above embodiment, arsenic or phosphorus is used as the n-type impurity. A p-type impurity such as boron can be ion-implanted at a depth greater than that of the n-type impurity, thereby reducing deep diffusion of the n-type impurity and the short channel effect.

Furthermore, the above embodiment is exemplified by an n-channel MOS type semiconductor device. However, the present invention may also be applied to a p-channel MOS type semiconductor device and a CMOS type semiconductor device.

What is claimed is:

1. A method for manufacturing a semiconductor device, comprising the steps of:
   forming a gate electrode on a surface of a gate oxide film on a semiconductor substrate;
   forming a first film on surfaces of said gate electrode and said semiconductor substrate;
   forming a non-single-crystalline silicon film to cover an entire surface;
   forming a second film to cover an entire surface;
   performing anisotropic or reactive ion etching of said second film to form residual second films on side walls of that step portion non-single-crystalline silicon film which is formed corresponding to a shape of said gate electrode;
   performing anisotropic or reactive ion etching of said non-single-crystalline silicon film using said residual second films as masks to form residual non-single-crystalline silicon films on said side walls of said gate electrode through said first film;
   ion-implanting an impurity having a conductivity type opposite to that of said semiconductor substrate using as masks said gate electrode and said residual non-single-crystalline silicon films;
   removing said residual non-single-crystalline silicon films; and
   annealing a resultant structure to activate the impurity so as to form source and drain regions each of which comprises an impurity region of a high impurity concentration and an impurity region of a low impurity concentration which is adjacent to said impurity region of high impurity concentration and which is located under a structure area corresponding to one of said residual non-single-crystalline silicon films which have been removed.

2. A method according to claim 1, further comprising the step of ion-implanting the impurity having the conductivity type opposite to that of said semiconductor substrate at a dose lower than that of ion implantation using said residual non-single-crystalline silicon films as the masks, using said gate electrode as the mask, before said non-single-crystalline silicon film is formed or after said residual non-single-crystalline silicon films are removed.

3. A method according to claim 2, further comprising the step of ion-implanting the impurity having the same conductivity type as that of said semiconductor substrate at a depth greater than that of ion implantation using the impurity having the conductivity type opposite to that of said semiconductor substrate, using one of said gate electrode and said residual non-single-crystalline silicon films as a mask/masks before said non-single-crystalline silicon film is formed or after said non-single-crystalline silicon film is etched using said residual second films as masks.

4. A method according to claim 1, wherein ion implantation of the impurity having the conductivity type opposite to that of said semiconductor substrate comprises ion implantation steps of two impurities, one of which is easy to diffuse and the other one of which is difficult to diffuse.

5. A method according to claim 4, further comprising the step of ion-implanting the impurity having the same conductivity type as that of said semiconductor substrate at a depth greater than that of ion implantation using the impurity having the conductivity type opposite to that of said semiconductor substrate, using one of said gate electrode and said residual non-single-crystalline silicon films as a mask/masks before said non-single-crystalline silicon film is formed or after said non-single-crystalline silicon film is etched using said residual second films as masks.

6. A method according to claim 1, wherein said non-single-crystalline silicon film comprises one of a polycrystalline silicon film and an amorphous silicon film.

7. A method according to claim 1, wherein said first film comprises one of a silicon oxide film and a silicon nitride film.

8. A method according to claim 1, wherein said second film comprises a film selected from the group consisting of a silicon oxide film, a silicon nitride film, an aluminum film and a molybdenum film.

9. A method according to claim 1, wherein said non-single-crystalline silicon film has a thickness of 0.1 to 1 $\mu$m, said first film has a thickness of 100 to 500 Å, and said second film has a thickness of 100 to 1,000 Å.

* * * * *